United States Patent [19]

Takashima

[11] Patent Number: 5,210,682
[45] Date of Patent: May 11, 1993

[54] RADIAL TYPE OF PARALLEL SYSTEM BUS STRUCTURE HAVING PAIRS OF CONDUCTOR LINES WITH IMPEDANCE MATCHING ELEMENTS

[75] Inventor: Tokuhei Takashima, Tokyo, Japan

[73] Assignee: Graphico Co., Ltd., Tokyo, Japan

[21] Appl. No.: 774,812

[22] Filed: Oct. 11, 1991

[30] Foreign Application Priority Data

Oct. 19, 1990 [JP] Japan ................................ 2-282366
Nov. 16, 1990 [JP] Japan ................................ 2-308847

[51] Int. Cl.$^5$ ............................................ H05K 7/00
[52] U.S. Cl. ................................. 361/396; 361/394; 361/399; 361/400; 361/401; 361/407; 361/412; 174/260; 257/734; 257/773; 257/750
[58] Field of Search ............... 361/396, 380, 391, 392, 361/393, 394, 397, 399, 400, 401, 407, 412, 413, 415; 357/65, 68, 70, 71, 74; 174/260

[56] References Cited

U.S. PATENT DOCUMENTS

| | | | |
|---|---|---|---|
| 3,794,784 | 2/1974 | Snider | 200/11 A |
| 4,734,825 | 3/1988 | Peterson | 361/414 |
| 4,801,996 | 1/1989 | Knotts | 337/68 |
| 4,888,663 | 12/1989 | Longerich et al. | 361/385 |
| 5,060,111 | 10/1991 | Takashima | 361/384 |
| 5,091,822 | 2/1992 | Takashima | 361/384 |

OTHER PUBLICATIONS

English translations of Japanese Pat. Appln. Nos. 1-102,909 1-152,985.

Primary Examiner—Leo P. Picard
Assistant Examiner—Young S. Whang
Attorney, Agent, or Firm—Birch, Stewart, Kolasch & Birch

[57] ABSTRACT

An improvement in a radial-and-parallel bus structure which includes a stack assembly of bus-printed disks whose centers are arranged on common center axis. Each bus-printed disk consists of a disk of dielectric material bearing on each of its opposite major surfaces, a printed radial pattern including a plurality of printed signal conductors of equal length radially extending from the center of the disk. Each signal conductor on one of the opposite major surfaces of the disk is coupled to a corresponding signal conductor on the other major surface to make up a signal conductor pair, and every signal conductor pair is terminated with an impedance matching element which is adapted to be connected to a selected lead in a selected one of CPU boards standing upright around the stack assembly of bus-printed disks. The impedance matching element prevents signal reflections of data being transmitted between selected CPU boards.

4 Claims, 6 Drawing Sheets

5,210,682

RADIAL TYPE OF PARALLEL SYSTEM BUS STRUCTURE HAVING PAIRS OF CONDUCTOR LINES WITH IMPEDANCE MATCHING ELEMENTS

BACKGROUND OF THE INVENTION

1. Field of the Invention

The present invention relates to an improvement in or relating to a bus which is used in connecting CPUs, memories and other components in computer systems.

2. Description of the Prior Art

As seen from FIG. 11, CPUs, memories and other components are fixed to substrate plates 1 with male or female elements of connectors 2, thus constituting component panels. These component panels are spaced and arranged parallel to each other with their connector elements 2 facing and connected to data, control, address and other buses 3.

Arrangement of component panels along an extended length of bus will inevitably cause transmission time of data between selected component panels to substantially vary depending on whether these component panels are selected within a relatively shorter range or within a relatively longer range.

This arrangement, therefore, requires the controlling of transmission time to reduce uneven delay of data transmission time due to different travelling distances between selected component panels. This makes the controlling of data transmission complicated, and makes quick transmission and processing of data difficult.

SUMMARY OF THE INVENTION

In an attempt to reduce these difficulties the inventor proposed a radial-and-parallel bus structure which comprises a stack assembly of bus-printed disks whose centers are arranged on a common center axis. Each bus-printed disk comprises a disk of dielectric material bearing on each of its opposite major surfaces, a printed radial pattern including a plurality of printed signal conductors of equal length radially extending from the center of the disk. Each signal conductor is connected to a selected lead in a selected one of CPU boards standing upright around the stack assembly of bus-printed disks. The radial arrangement of signal conductors permits transmission of data between selected CPU boards in equal short time ( See Japanese Patent application Nos.1-102,909 or U.S. counterpart comprising U.S. Pat. No. 5,060,111 and 1-152,985 or U.S. counterpart U.S. Pat. No. 5,091,822.

One object of the present invention is to provide a radial-and-parallel bus structure which is guaranteed free from reflection and distortion of signals traveling on its signal conductors.

To attain this object a radial-and-parallel bus structure is improved according to the present invention in that each bus-printed disk comprises: a disk of dielectric material bearing on each of its opposite major surfaces, a printed radial pattern including a plurality of printed signal conductors of equal length radially extending from the center of the disk, each signal conductor on one of the opposite major surfaces of the disk being coupled to a corresponding signal conductor on the other major surface to make up a signal conductor pair; a plurality of impedance matching elements each connected to each signal conductor pair; and means to connect each of said impedance matching elements to a selected lead in a selected one of CPU boards standing upright around said stack assembly of bus-printed disks.

With this arrangement all signal conductor pairs at a same angular position each of all disks constitute together a longitudinally parallel arrangement of signal conductor pairs as many as the disks, and the so constituted longitudinal arrangements as many as the signal conductor pairs on the disk stand upright about the common center axis at regular angular intervals, thus constituting a three-dimensional bus structure having signal conductors extending radially from the common center axis in parallel. These longitudinal arrangements of parallel signal conductors are allotted to data, address, control and other functional lines.

Termination of signal conductors of equal length with impedance matching elements assures that data can be transmitted between selected component panels in equal time without reflection.

BRIEF DESCRIPTION OF THE DRAWINGS

Other objects and advantages of the present invention will be understood from the following description of radial-and-parallel bus structures according to preferred embodiments of the present invention, which are shown in accompanying drawings.

DETAILED DESCRIPTION OF PREFERRED EMBODIMENTS

Figure 1:
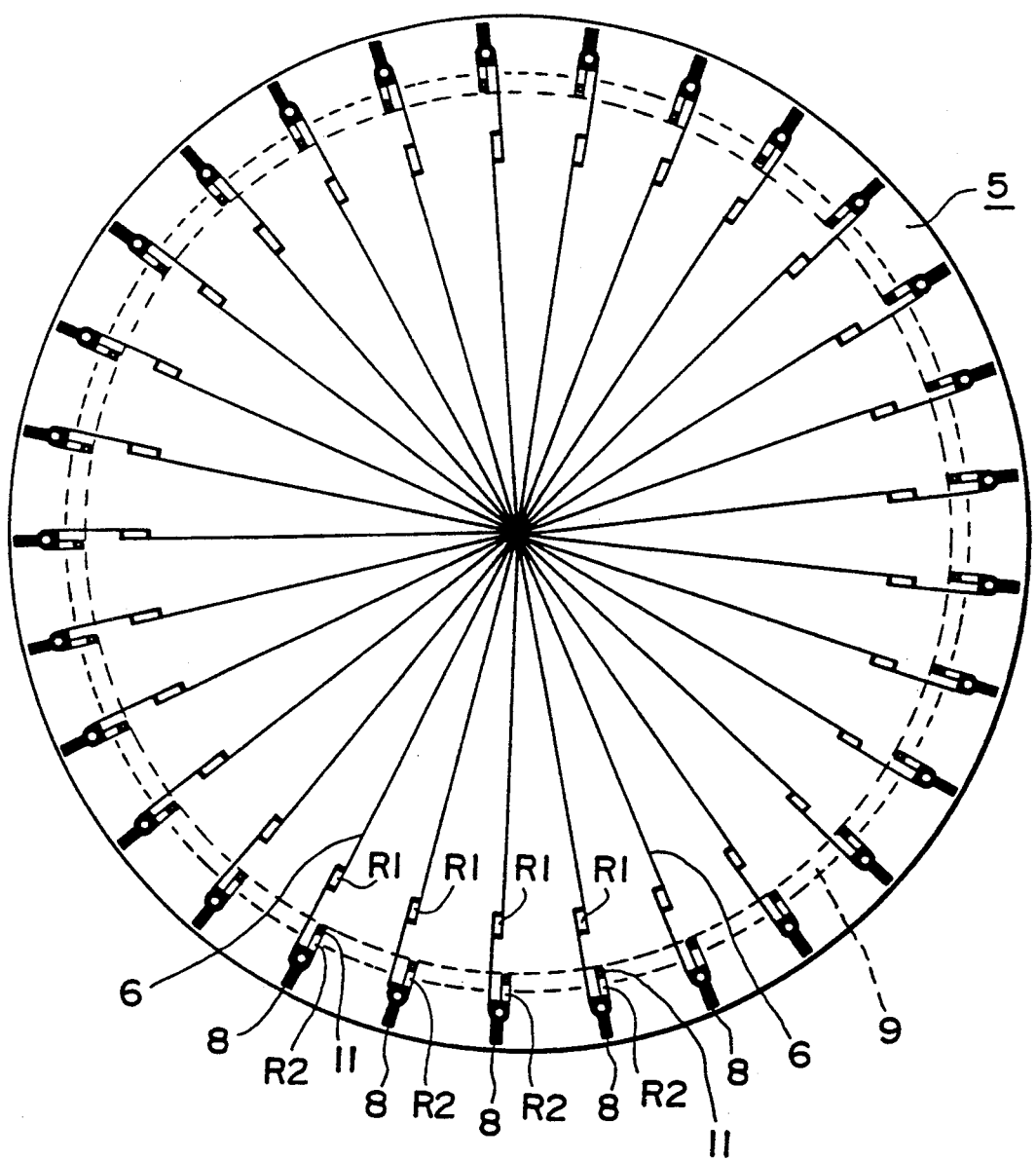
FIG. 1 is a top planar view of a bus-printed disk.

As shown in FIG. 1, bus-printed disk 5 is consisted of a dielectric disk having radial conductor patterns printed on its opposite major surfaces.

More specifically, bus-printed disk 5 has a plurality of linear signal conductors of equal length 6 or 7 radiating from the center of the disk at regular angular intervals on each major surface of the disk, and a signal conductor at a given angular position on one of the major surfaces of the disk is coupled to a corresponding signal conductor at a same angular position on the other major surface of the disk to constitute a signal conductor pair. Thus, a plurality of signal conductor pairs ( say 31 pairs ) each composed of two equiphase conductors 6 and 7 on the opposite major surfaces of the disk are provided (See FIG. 1).

The end of each signal conductor 6 on one major surface or upper surface of disk 5 is connected to associated terminal piece 8 on the circumference of disk 5 via resistor means R1, which is preferably given in the form of printed resistor or chip resistor.

On the other hand the end of each signal conductor 7 on the other major surface or lower surface of disk 5 is connected to annular ground conductor 9 on the circumference of disk 5 via resistor means R1. Annular ground conductor 9 is connected to islands 11 on upper surface via plated through holes 10, and islands 11 are connected to terminal pieces 8 via resistor means R2( See FIGS. 2 and 3), which are preferably given in the form of printed resistor or chip resistor.

Figure 4:
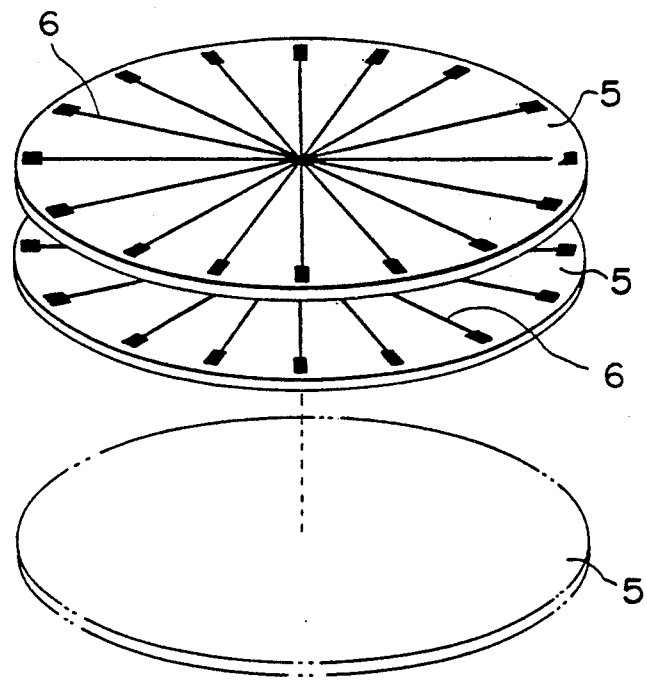
FIG. 4 is a perspective view showing a vertical arrangement of bus-printed disks.

As seen from FIG. 4, a plurality of bus-printed disks 5 are arranged at regular intervals with their centers on a common center axis and with their signal conductors put in registration with each other. A stack assembly of bus-printed disks 5 results. With this arrangement the equiphase signal conductor pairs of all disks constitute together a longitudinally parallel arrangement of signal conductor pairs as many as the disks, and the so constituted longitudinal arrangements as many as the signal conductor pairs on the disk stand upright about the common center axis at regular angular intervals, thus constituting a three-dimensional bus structure having signal conductors extending radially from the common center axis in parallel. These longitudinal arrangements of parallel signal conductors are allotted to data, address, control and other functional lines.

Figure 2:
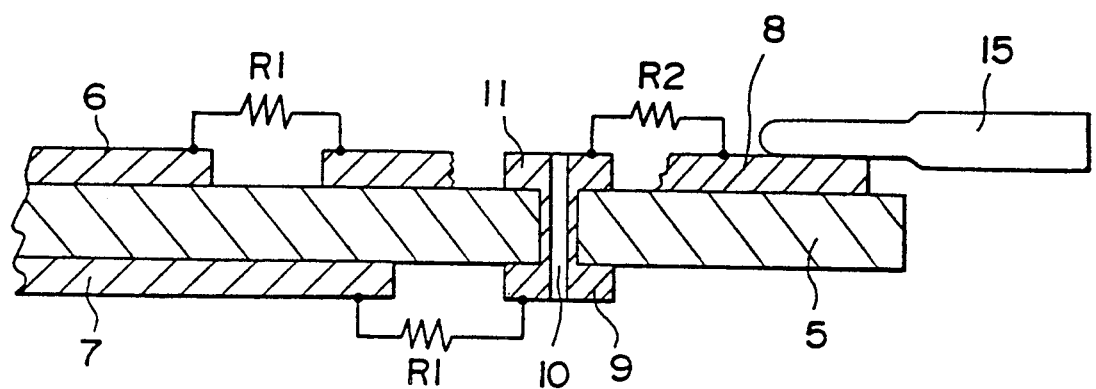
FIG. 2 is an enlarged sectional view showing the terminal portion of a signal conductor pair.
Figure 3:
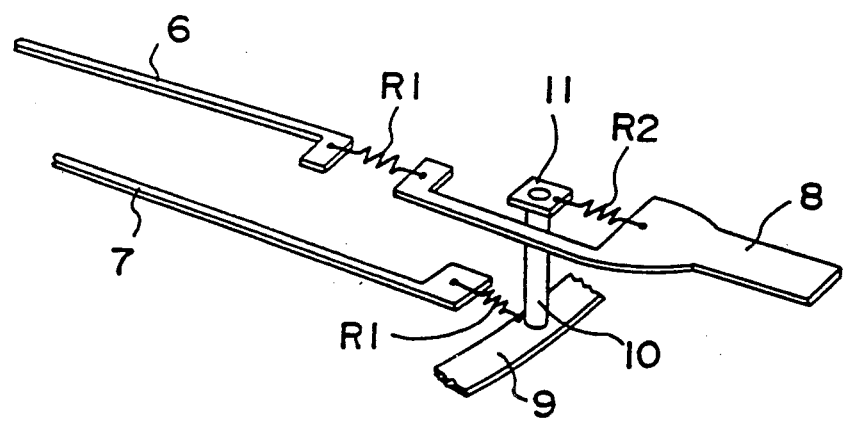
FIG. 3 is a perspective view of the terminal portion of a signal conductor pair.
Figure 5:
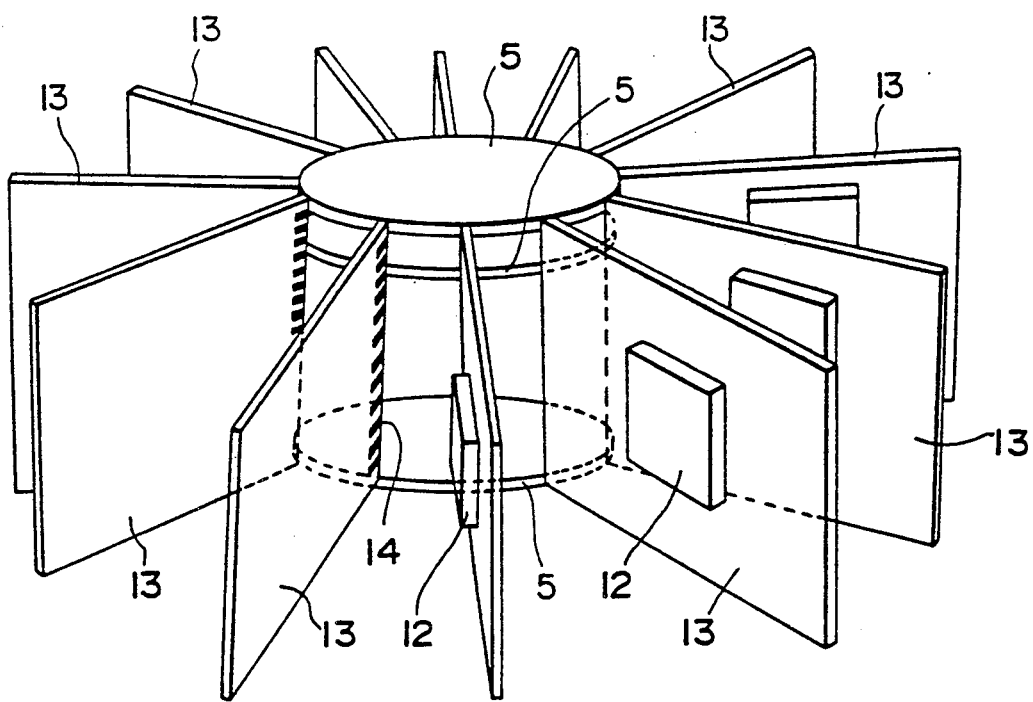
FIG. 5 is a perspective view showing a radial-and-parallel bus structure with CPUs standing upright therearound.

Printed circuit boards 13 each bearing a signal processor unit 12 are arranged around the stack assembly of bus-printed disks 5 (See FIG. 5). These printed circuit boards 13 stand upright around the stack assembly of disks 5, extending radially therefrom. Plugs (or receptacles) 14 of each printed circuit board 13 are mated with corresponding receptacles (or plugs) of all disks 5, thereby connecting to selected terminal pieces 8 of all disks 5. FIG. 2 shows receptacle 15 fixed to terminal piece 8 on disk 5 to permit insertion of a corresponding plug of printed circuit board 13.

CPUs, memories or input/output processors for controlling inputting devices such a keyboards or display devices may be attached to printed circuit boards 13.

Figure 6:
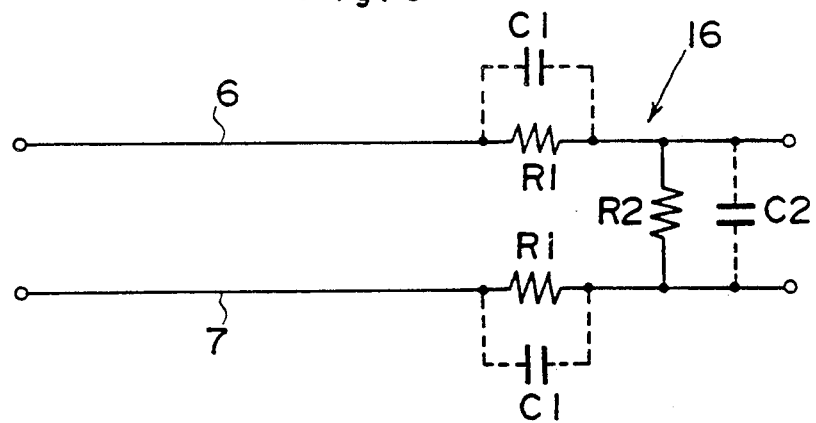
FIG. 6 shows an equivalent circuit diagram of a signal conductor pair for signals at a relatively high frequency.

FIG. 6 shows an equivalent circuit for a signal conductor pair which is composed of two signal conductors 6 and 7 radially extending from the center of disk 5 on its opposite major surfaces.

In FIG. 6 C1 stands for a stray or parasitic capacitor appearing across resistor R1, and C2 stands for a stray capacitor appearing between signal conductors 6 and 7. These capacitors and resistors constitute, in combination, an impedance matching circuit as shown in the drawing.

Assume that "N" radial transmission lines each composed of a signal conductor pair are provided on disk 5. Each radial transmission line, which is equivalent to the circuit of FIG. 6, can be assumed to branch into "N−1" transmission lines each being equivalent to the circuit of FIG. 6.

The values of resistors R1 and R2 can be determined on the assumption just described and in consideration of the characteristic impedance of the transmission line and other circuit factors. Impedance matching elements thus determined will prevent erroneous transmission of data between signal processing units 12.

Figure 7:
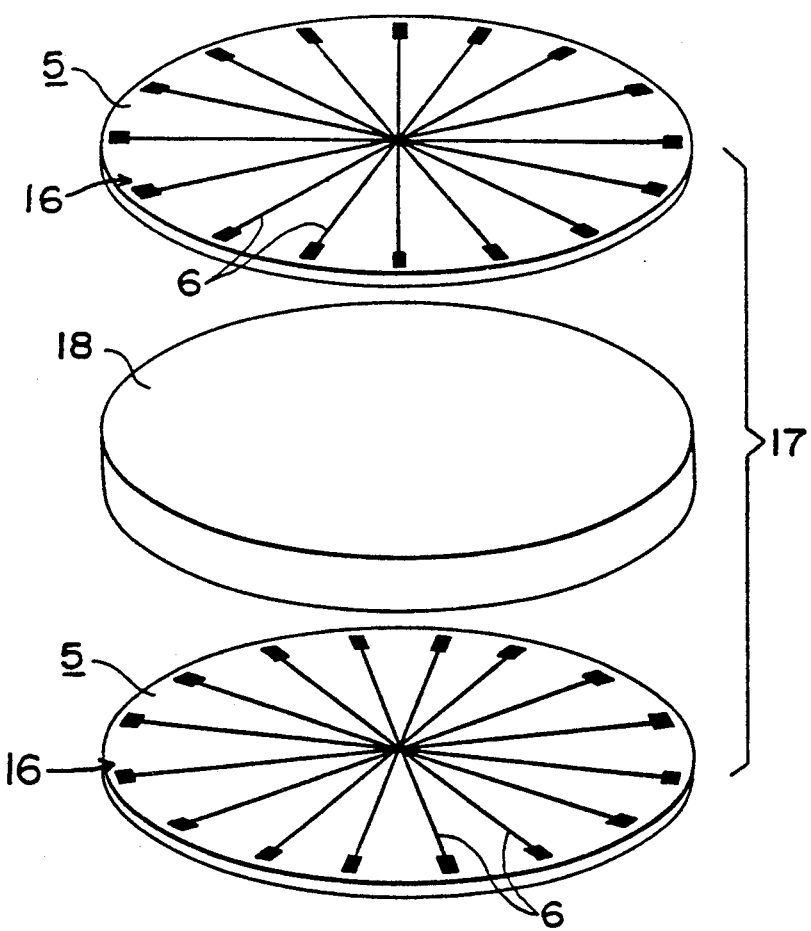
FIG. 7 shows a vertical arrangement of bus-printed disks in a radial-and-parallel bus structure according to another embodiment.

FIG. 7 shows a composite type of bus-printed disk 17 as comprising upper bus-printed disk 5 having signal conductors 6 radiating from its center, intermediate prepreg disk 18 and lower bus-printed disk 5 having signal conductors 6 radiating from its center. Lower bus-printed disk 5 is rotated so that each radial signal conductor 6 in lower disk 5 may be put between adjacent radial signal conductors 6 in upper disk 5. Each signal conductor is terminated with impedance matching element 16. This staggered arrangement of radial signal conductors 6 permits the use of staggered male or receptacle arrangement of a conventional connector in making up a water wheel-like computer assembly as shown in FIG. 5.

Figure 8:
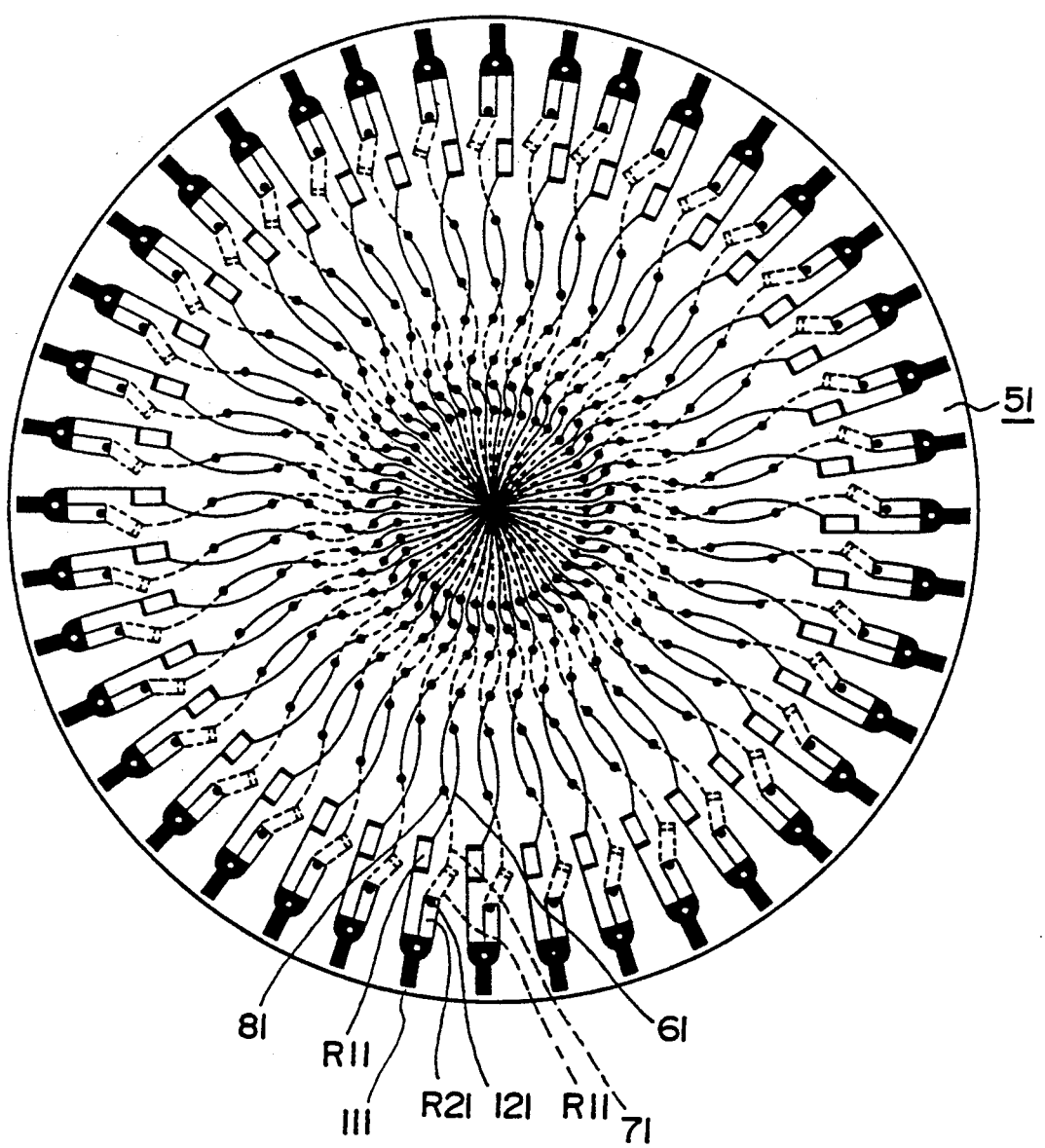
FIG. 8 is a plane view of a bus-printed disk used in a radial-and-parallel bus structure according to still another embodiment.

FIG. 8 shows a bus-printed disk 51 having twisted signal conductors 61 and 71 radiating from its center. A disk of dielectric material has a plurality of plated through holes 81 made at intervals along each radial line, and each signal conductor pair comprises two conductors 61 (upper surface) and 71 (lower surface) passing through every other hole 81 to alternately appear on upper or lower surface of the disk, thus making up twisted signal conductors of equal length.

Figure 9:
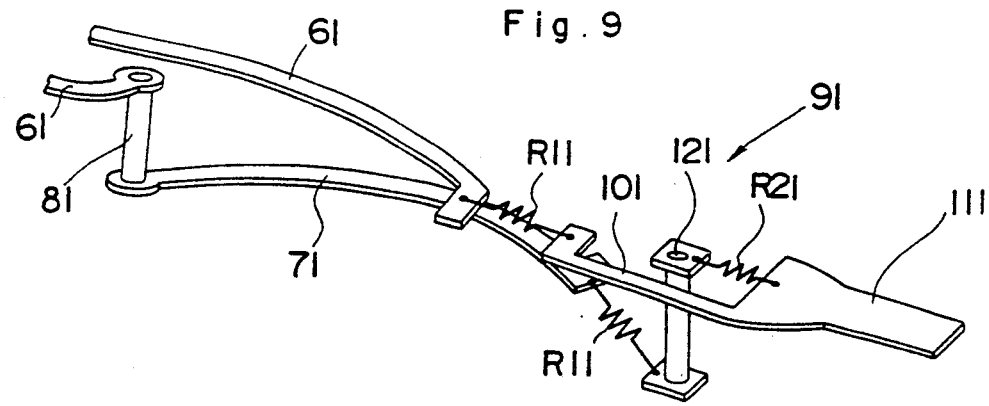
FIG. 9 is a perspective view of the terminal portion of a signal conductor pair in FIG. 8, showing how resistors are connected between signal conductors and associated terminal tags.

As seen from FIG. 9, the end of each signal conductor 61 on upper surface of disk 51 is connected to one end of resistor R11 of impedance matching element 91 whereas the end of each signal conductor 71 on lower surface of disk 51 is connected to one end of resistor R11 of impedance matching element 91. The other end of resistor R11 on upper surface of disk 51 is connected to extension 101 of terminal piece 111 on the circumference of disk 51 whereas the other end of resistor R11 on lower surface of disk 51 is connected to terminal piece 111 via plated through hole 121 and resistor R21.

As is the case with a radial-and-parallel bus structure as shown in FIGS. 4 and 5, a plurality of disks 51 each having twisted signal conductors radiating from its center at regular angular intervals are arranged vertically with their centers on a common center axis and with their twisted signal conductor pairs in registration with each other in all disks. With this arrangement all equiphase signal conductor pairs of all disks 51 constitute together a longitudinally parallel arrangement of signal conductor pairs as many as the disks, and the so constituted longitudinal arrangements as many as the twisted signal conductor pairs on the disk stand upright about the common center axis at regular angular intervals, thus constituting a three-dimensional bus structure having twisted signal conductors extending radially from the common center axis in parallel. These longitudinal arrangements of parallel signal conductors are allotted to data, address, control and other functional lines.

Figure 10:
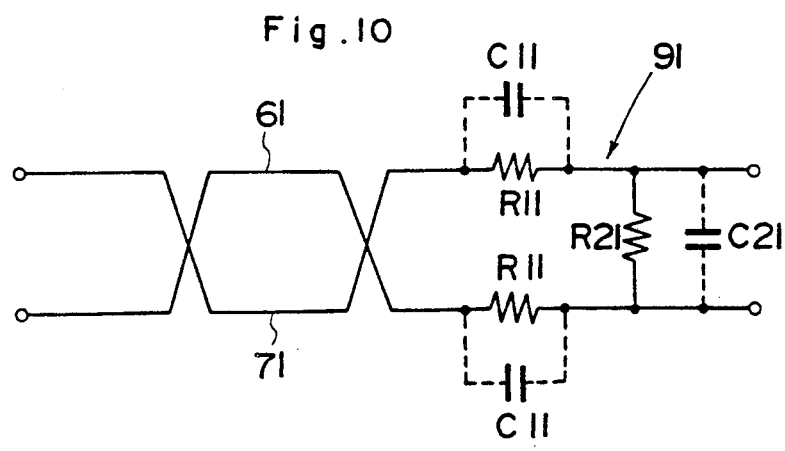
FIG. 10 shows an equivalent circuit diagram of a signal conductor pair in FIG. 8 for signals at a relatively high frequency.
Figure 11:
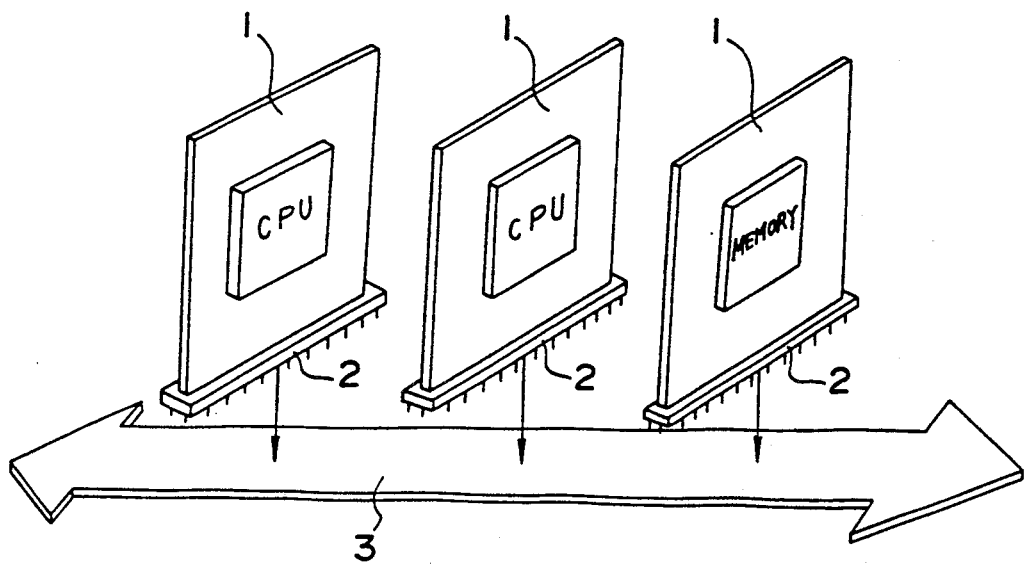
FIG. 11 is a perspective view of conventional arrangement of component panels along a bus.

FIG. 10 shows an equivalent circuit diagram of a twisted signal conductor pair for signal of high frequency.

The twisting of conductors 61 and 71 of upper and lower surfaces of disk 51 has the effect of cancelling electrostatic or magnetic inductions, thus making the transmission lines less sensitive to exterior noise and, at the same time, suppressing undesired radiation of electromagnetic wave from transmission lines.

What is claimed is:

1. A radial-and-parallel bus structure comprising a stack assembly of bus-printed disks whose centers are arranged on a common center axis, each bus-printed disk comprising:
- a disk of dielectric material bearing on each of its opposite major surfaces, a printed radial pattern including a plurality of printed signal conductors of equal length radially extending from the center of the disk, each signal conductor on one of the opposite major surfaces of the disk being coupled to a corresponding signal conductor on the other major surface to make up a signal conductor pair;
- a plurality of impedance matching elements each connected to each signal conductor pair; and
- means to connect each of said impedance matching elements to selected ones of a plurality of central processing the CPU boards standing upright around said stack assembly of bus-printed disks.

2. The radial-and-parallel bus structure according to claim 1 wherein said signal conductor pair comprises a signal conductor at a predetermined angular position on one of the opposite major surfaces of the disk and the corresponding signal conductor at same said predetermined angular position on the other major surface.

3. The radial-and-parallel bus structure according to claim 1 wherein each disk has a plurality of through holes made at intervals along respective pairs of radial lines as the signal conductor pairs; and said signal conductor pair comprises two conductors passing through every other hole to alternately appear on one or the other major surface of the disk, thus making up twisted signal conductors.

4. The radial-and-parallel bus structure according to any of claims 1 to 3 wherein each of said impedance matching elements includes a resistor and a distributed capacitance coupled between said signal conductor pairs.

* * * * *